(12) United States Patent
DiPoala (10) Patent No.: US 8,525,880 B2
(45) Date of Patent: Sep. 3, 2013

(54) SECURITY SYSTEM INCLUDING MODULAR RING HOUSING

(75) Inventor: William DiPoala, Fairport, NY (US)

(73) Assignee: Robert Bosch GmbH, Stuttgart, DE (US)

( * ) Notice: Subject to any disclaimer, the term of this patent is extended or adjusted under 35 U.S.C. 154(b) by 1257 days.

(21) Appl. No.: 12/275,499

(22) Filed: Nov. 21, 2008

(65) Prior Publication Data

US 2010/0128446 A1 May 27, 2010

(51) Int. Cl.
*H04N 9/47* (2006.01)
(52) U.S. Cl.
USPC ......................................................... 348/143
(58) Field of Classification Search
USPC .................................................. 348/143, 159
See application file for complete search history.

(56) References Cited

U.S. PATENT DOCUMENTS

| | | | |
|---|---|---|---|
| 5,551,882 A | 9/1996 | Whiteman, Jr. et al. | |
| 6,268,882 B1 * | 7/2001 | Elberbaum | 348/151 |
| 6,322,232 B1 | 11/2001 | Oliver | |
| 7,033,195 B2 * | 4/2006 | Murphy et al. | 439/307 |
| 7,042,494 B2 | 5/2006 | Broemmelsiek et al. | |
| 7,211,749 B2 * | 5/2007 | Jenkins | 200/43.08 |
| 2002/0063621 A1 * | 5/2002 | Tseng et al. | 340/2.7 |
| 2005/0275719 A1 | 12/2005 | Millar et al. | |
| 2006/0147194 A1 * | 7/2006 | Jones | 396/427 |
| 2007/0026696 A1 * | 2/2007 | Kostrzewski et al. | 439/37 |
| 2007/0126872 A1 * | 6/2007 | Bolotine et al. | 348/151 |
| 2007/0208892 A1 * | 9/2007 | Betts-LaCroix et al. | 710/62 |
| 2007/0268687 A1 | 11/2007 | Scannel, Jr. | |
| 2008/0211915 A1 * | 9/2008 | McCubbrey | 348/159 |
| 2009/0171163 A1 * | 7/2009 | Mates et al. | 600/300 |

FOREIGN PATENT DOCUMENTS

FR 2786034 A1 * 5/2000

* cited by examiner

*Primary Examiner* — Imad Hussain
(74) *Attorney, Agent, or Firm* — Keith Swedo; Taft Stettinius & Hollister LLP (57) ABSTRACT

A modular building system arrangement includes a plurality of electrical building systems. Each electrical building system has a housing with a mechanical connector that is connectable with a like connector of each other building system housing. Members of any subset of the building system housings are connectable with each other to form a building system assembly. The building systems of the building system assembly conjointly define an electrically conductive pathway interconnecting each of the building systems of the building system assembly. The pathway carries power and/or data.

20 Claims, 10 Drawing Sheets

SECURITY SYSTEM INCLUDING MODULAR RING HOUSING

BACKGROUND OF THE INVENTION

1. Field of the Invention

The present invention relates to security systems, and, more particularly, to security systems that are subject to being occasionally serviced, reconfigured or upgraded.

2. Description of the Related Art

Security systems are commonly used by retail stores, banks, casinos and other organizations to monitor activities within a given area. A typical small commercial building has several independent systems installed to provide various functions. For example, a building may include a fire alarm system, burglar alarm system, intercom system, video security system, background music system, and/or an emergency lighting system, which are all independent systems.

The control stations and system devices are spread throughout the building at various locations. It is common to see several of the different system devices next to each other. This requires multiple wiring systems to be run. This adds cost to the building owner since the systems are usually installed by different contractors. This also results in a hodge-podge look to the building since the wall or ceiling is cluttered with devices having different appearances.

Typical security systems are constructed as a single unit. When any portion of the security system is faulty, the entire unit must be removed from a mounted arrangement and returned to the manufacturer. Such a unitary configuration hampers the ability to make field repairs of existing units and causes a number of warranty return problems.

The unitary construction of the typical security system prevents easy reconfiguration, upgrading, and maintenance of existing units. When individual components in the system need to be upgraded or replaced, the entire unit must be removed and replaced with a new unit. This requirement of replacing the entire system whenever an individual component thereof needs to be replaced or upgraded adds to the cost and complexity of maintaining, upgrading and/or reconfiguring the security system.

What is neither disclosed nor suggested by the prior art is a security system that does not need to be replaced as a unit whenever an individual component of the system needs to be reconfigured, replaced, or upgraded. What is also neither disclosed nor suggested by the prior art is a security system that enables multiple independent systems to be compactly and aesthetically installed in a same housing.

SUMMARY OF THE INVENTION

The present invention provides a modular housing that several build systems may be integrated into. The housing may include a set of interchangeable rings that may be coupled together in a stack. The interchangeable ring design may allow multiple system devices, such as for fire alarm, burglar alarm, intercom, video security, background music, and emergency lighting, to be installed at one location on a common electrical cable. The ring design may allow for a common design language (industrial design), thereby making it more aesthetically pleasing to the building owner. The interchangeable ring design may allow for different combinations of devices to be used at different locations as needed. For example, emergency lighting may be needed at a greater number of locations than are video cameras.

The invention comprises, in one form thereof, a modular building system arrangement including a plurality of electrical building systems. Each electrical building system has a housing with a mechanical connector that is connectable with a like connector of each other building system housing. Members of any subset of the building system housings are connectable with each other to form a building system assembly. The building systems of the building system assembly conjointly define an electrically conductive pathway interconnecting each of the building systems of the building system assembly. The pathway carries power and/or data.

The invention comprises, in another form thereof, a modular building system arrangement including a base having an upper surface and a lower surface. The upper surface is mounted to a fixed structure. The lower surface has at least one first lower electrical connector. Each of a plurality of electrical building systems includes an upper surface and a lower surface. The upper surface has at least one upper electrical connector. The lower surface has at least one second lower electrical connector electrically connected to the at least one upper electrical connector. Each upper electrical connector is connectable with the first lower connector of the base and connectable with the second lower connector of each other building system. Members of any subset of the building systems are connectable with each other in any order to form a building system assembly. An end cap module is connectable to a distal one of the electrical building systems that is farthest from the base in the building system assembly such that the at least one second lower electrical connector of the distal electrical building system is substantially covered by the end cap module.

The invention comprises, in yet another form thereof, a modular building system arrangement including a base mounted to a fixed structure. The base includes at least one first lower mechanical connector. Each of a plurality of electrical building systems includes at least one upper mechanical connector and at least one second lower mechanical connector. Each upper mechanical connector is connectable with the first lower connector of the base and is connectable with the second lower connector of each other building system. Members of any subset of the building systems are connectable with each other in any order to form a building system assembly. An end cap is connectable to the at least one second lower mechanical connector of a distal one of the electrical building systems that is farthest from the base in the building system assembly.

An advantage of the present invention is that individual building systems that are included in the security system may be quickly and easily removed and replaced with a fully functioning or upgraded building system without removing the security system from its use in the field.

Another advantage is that it is possible to remove and install individual building systems of the security system without the use of tools.

Yet another advantage is that it is not necessary to remove electrical power from the security system when removing or installing a building system.

A further advantage is that a number of diverse building systems may be installed in a compact and aesthetically pleasing package.

BRIEF DESCRIPTION OF THE DRAWINGS

The above mentioned and other features and objects of this invention, and the manner of attaining them, will become more apparent and the invention itself will be better understood by reference to the following description of embodiments of the invention taken in conjunction with the accompanying drawings, wherein.

Corresponding reference characters indicate corresponding parts throughout the several views. Although the exemplification set out herein illustrates embodiments of the invention, in several forms, the embodiments disclosed below are not intended to be exhaustive or to be construed as limiting the scope of the invention to the precise forms disclosed.

DESCRIPTION OF THE PRESENT INVENTION

Figure 1:
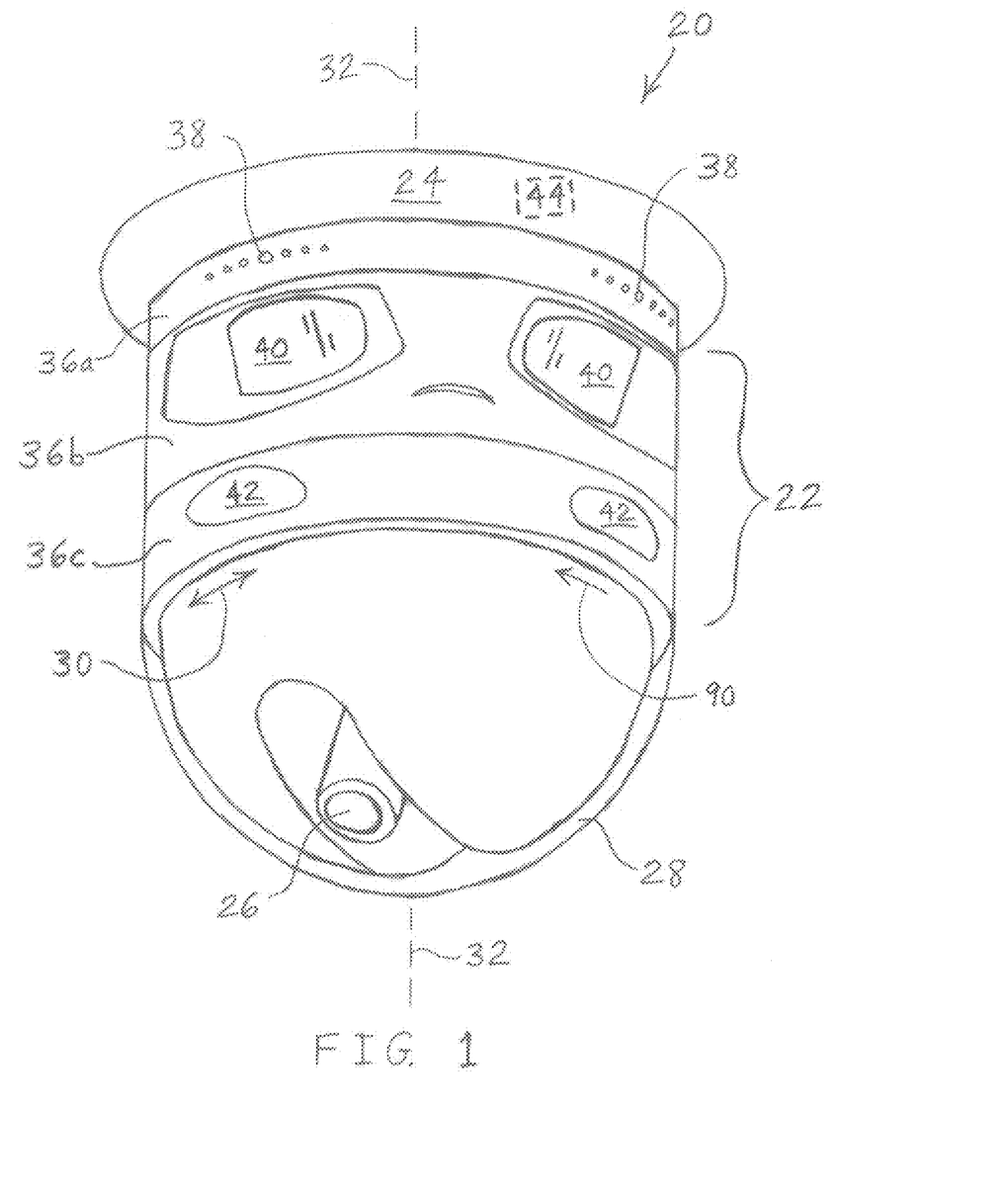
FIG. 1 is a bottom perspective view of one embodiment of a modular building system arrangement of the present invention.
Figure 2:
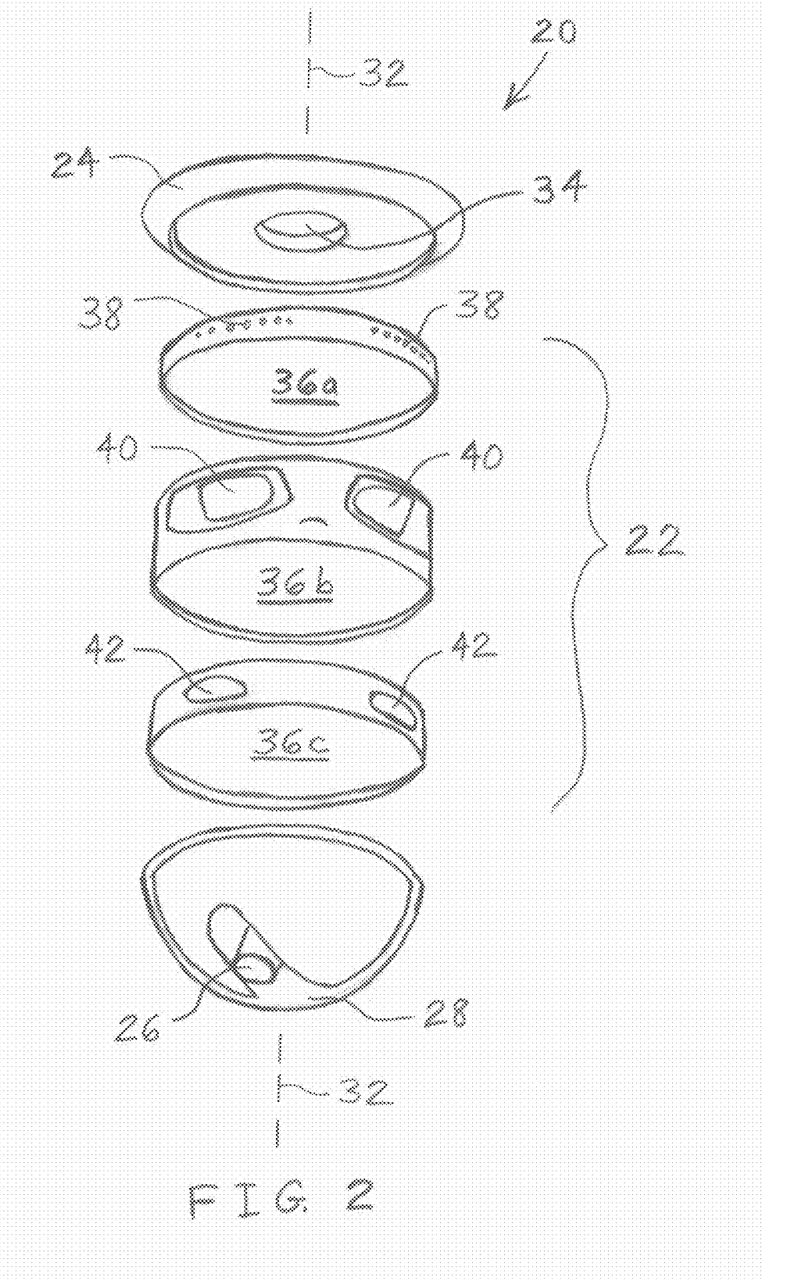
FIG. 2 is an exploded bottom perspective view of the modular building system arrangement of FIG. 1.
Figure 3:
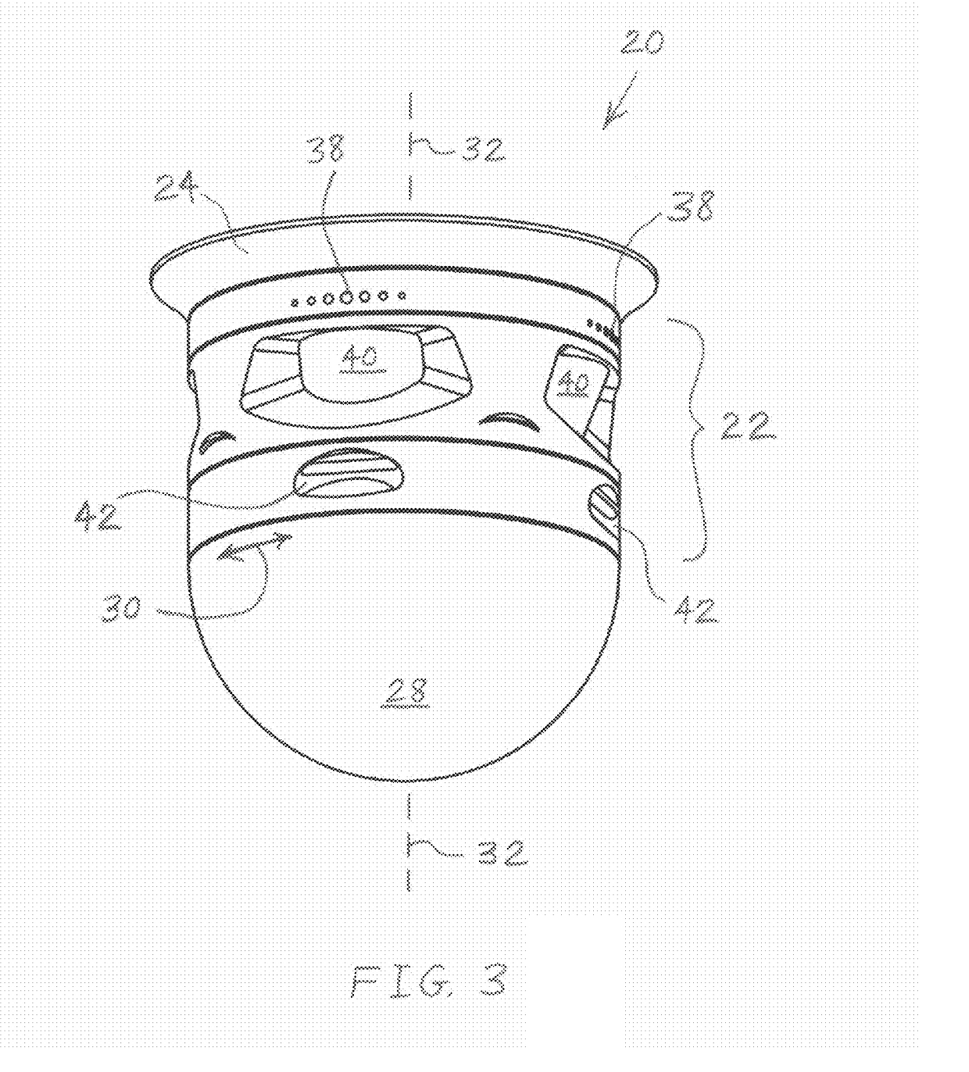
FIG. 3 is another bottom perspective view of the modular building system arrangement of FIG. 1.

Referring now to the drawings and particularly to FIGS. 1 and 2, there is shown one embodiment of a modular building system arrangement 20 of the present invention for incorporation into a fixed structure such as a building, or, more particularly, a ceiling of a building. Modular building system arrangement 20 includes a building system assembly 22 coupled to a base 24 at an upper end thereof, and to an electrical end cap module in the form of a surveillance camera 26 at a lower end thereof. Camera 26 may be connected to a hemispherical covert liner 28 that covers camera 26. Although camera 26 is visible through liner 28 in FIG. 1 for ease of illustration, liner 28 may be opaque when viewing in a radially inward direction such that camera 26 cannot be seen with the naked eye by a casual observer, as shown in FIG. 3. However, camera 26 may capture, through liner 28, images of objects outside of liner 28. Camera head 26 may be rotatable relative to the remainder of arrangement 20 in directions indicated by double arrow 30 about a pan axis or longitudinal axis 32.

Base 24 may be secured to a ceiling or other fixed structure such as by screws. Base 24 may include a through channel 34 for carrying wires (not shown) therein. The wires may extend through the ceiling or other fixed structure. The wires may provide electrical power and control signals or other data from a camera monitoring system, "head end unit", or other controller to building system assembly 22 and surveillance camera 26. The wires may also carry data and signals, including video signals from camera 26 and signals from building system assembly 22 to the camera monitoring system or other controller.

Building system assembly 22 may include different building systems 36a-c stacked on top of each other such that building systems 36a-c are aligned along axis 32. In the particular embodiment shown in the drawings, assembly 22 includes building systems in the form of a microphone ring 36a, a passive infrared (PIR) motion detection ring 36b, and a lighting ring 36c. Microphone ring 36a includes multiple microphones 38 for location identification. That is, monitoring personnel may determine the location of intruders and other sources of sound by listening to the outputs of microphones 38. For example, microphone ring 36a may support a glass break alarm function which uses direction information for the glass break function. The direction information may also be used to decide in which direction to steer or point camera 26. Microphone ring 36a generally provides listen-in audio to a central station or end user.

PIR motion detection ring 36b may include four PIR sensors 40 to provide motion quadrant information that may be used to point camera 26. PIR motion detection ring 36b may also provide a motion alarm signal, which may be fused with video motion detection.

Lighting ring 36c includes light bulbs 42 for providing room lighting, or for illuminating the images captured by camera 26. Lighting ring 36c may be in the form of a strobe ring that provides a strobe light or flash for a fire alarm, a quick flash sequence for camera illumination, and/or a high output flash for confusing an intruder.

Base 24 may include a processor 44 which collects data from building systems 36 and camera 26 and which performs some processing and/or control operations. For example, processor 44 may receive PIR quadrant information transmitted by PIR sensors 40 and may use this information to reposition camera 26. Processor 44 may also receive video motion detection information from camera 26 and may use this information to verify an alarm signal from PIR sensors 40. Processor 44 may function as a centralized controller for all of building system arrangement 20. Processor 44 may communicate audio, video, motion alarms, etc., via internet protocol (IP).

Base 24 may also include a slip ring (not shown) which enables camera head 26 to rotate freely while still maintaining electrical contact between camera 26 and the wires carried in through channel 34. More particularly, the slip ring may have a bottom terminal that is rotatable along with camera head 26. Base 24 may include a local bus structure which enables communication between processor 44, building systems 36, and camera 26 via the slip ring. Instead of a slip ring, in another embodiment base 24 may be powered by AC mains and may communicate via radio frequency (e.g., Zigbee) in order to simplify wiring and installation. Base 24 may include firmware that may be updated via internet protocol. Base 24 may incorporate some level of sensor data fusion or function as a sensor data information hub.

Camera 26 may be positioned in the bottommost position of arrangement 20, as shown in the drawings, such that camera 26 is provided with an optimal view that is unimpeded by building systems 36. In embodiments wherein video is not needed, camera 26 may be omitted and liner 28 may nevertheless be provided as a "dummy dome" in order to cause would be wrongdoers to believe that their actions may be monitored and/or recorded on video. Instead of a dummy dome, a low profile end cap could be provided at the bottommost position in applications wherein video is not needed.

Figure 4:
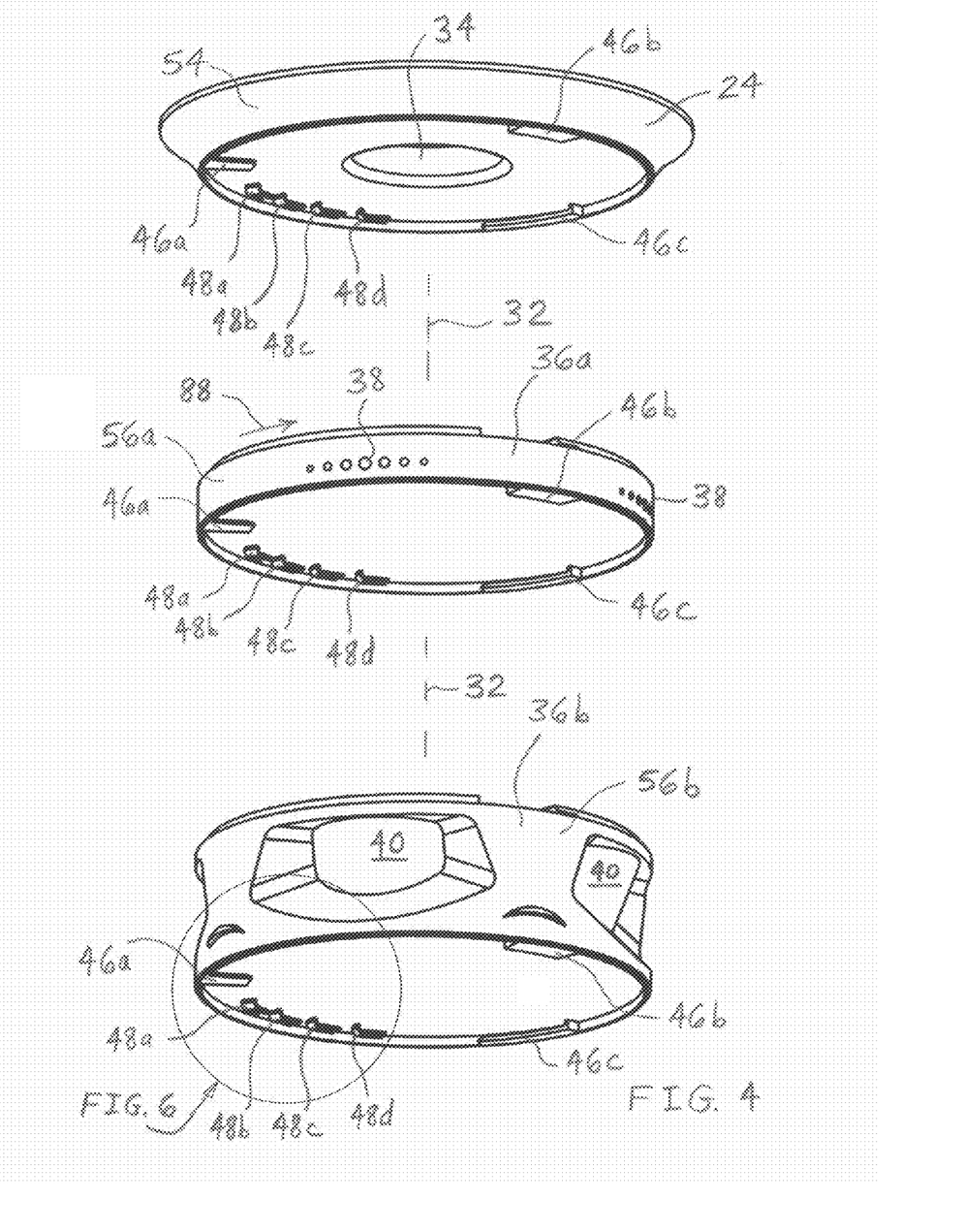
FIG. 4 is an enlarged exploded bottom perspective view of the base and top two building systems of the modular building system arrangement of FIG. 1.
Figure 5:
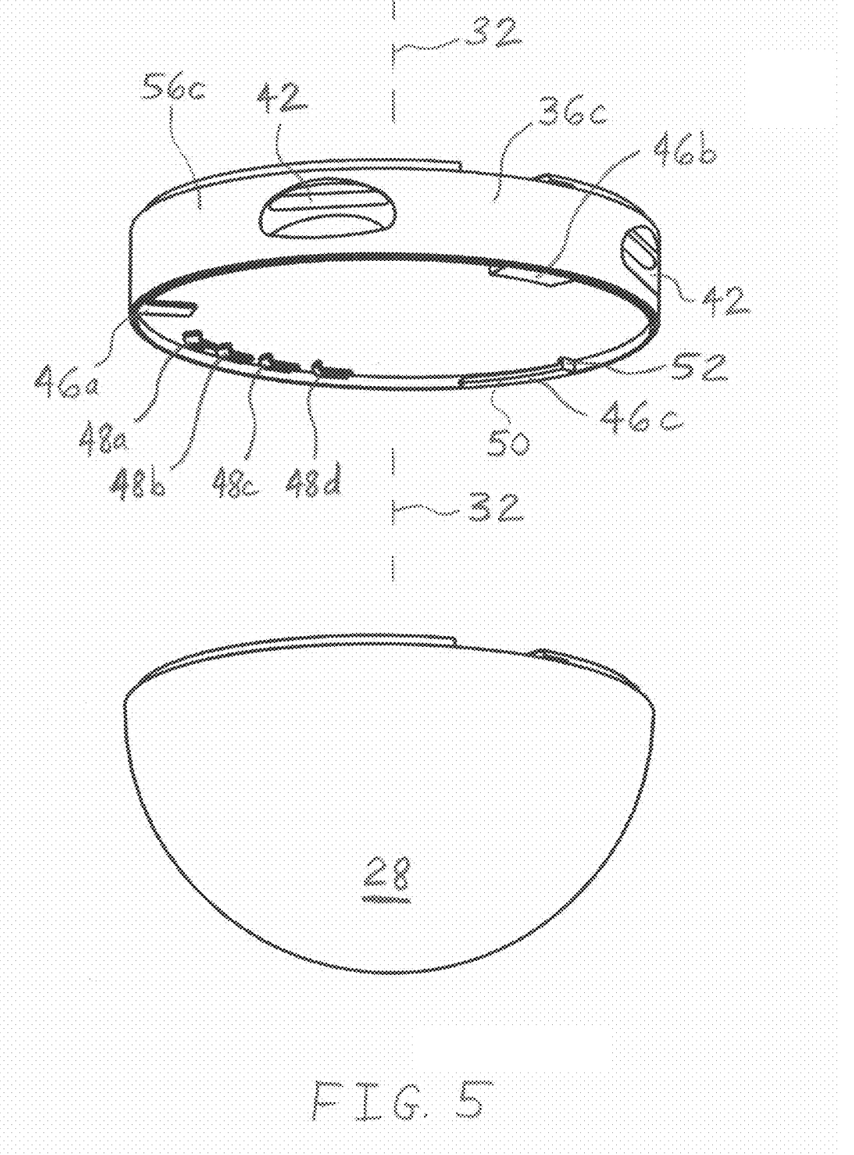
FIG. 5 is an enlarged exploded bottom perspective view of the bottom building system and end cap of the modular building system arrangement of FIG. 1.

As shown in the more detailed views of FIGS. 4 and 5, each of base 24, building system 36a, building system 36b, and building system 36c includes an identical set of mechanical connectors 46a-c and an identical set of female electrical connectors or metal clips 48a-d. In addition to each set of mechanical connectors and each set of electrical connectors being identical, each of mechanical connectors 46a-c within a set may be identical, and each of electrical connectors 48a-d within a set may be identical. Each of mechanical connectors 46a-c may be L-shaped and may include a cantilever arcuate portion 50 (FIG. 5) connected to a cantilever arm portion 52 extending upwardly from an end of portion 50. Each of arcuate portion 50 and arm portion 52 projects in a radially inward direction from a corresponding annular housing 54, 56a-c of base 24 and building systems 36a-c, respectively.

Figure 6:
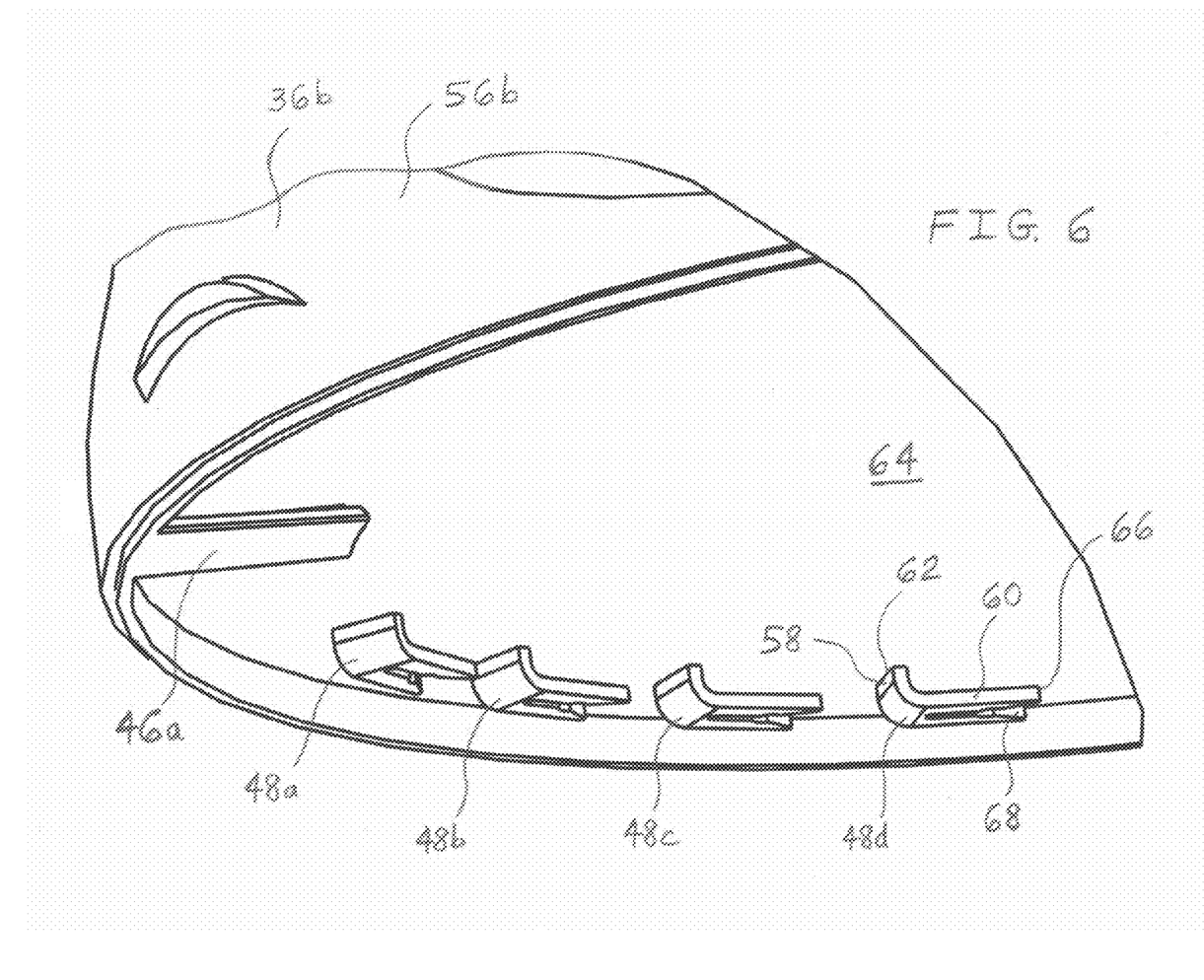
FIG. 6 is a fragmentary enlarged bottom perspective view of the bottom building system of FIG. 5.
Figure 7:
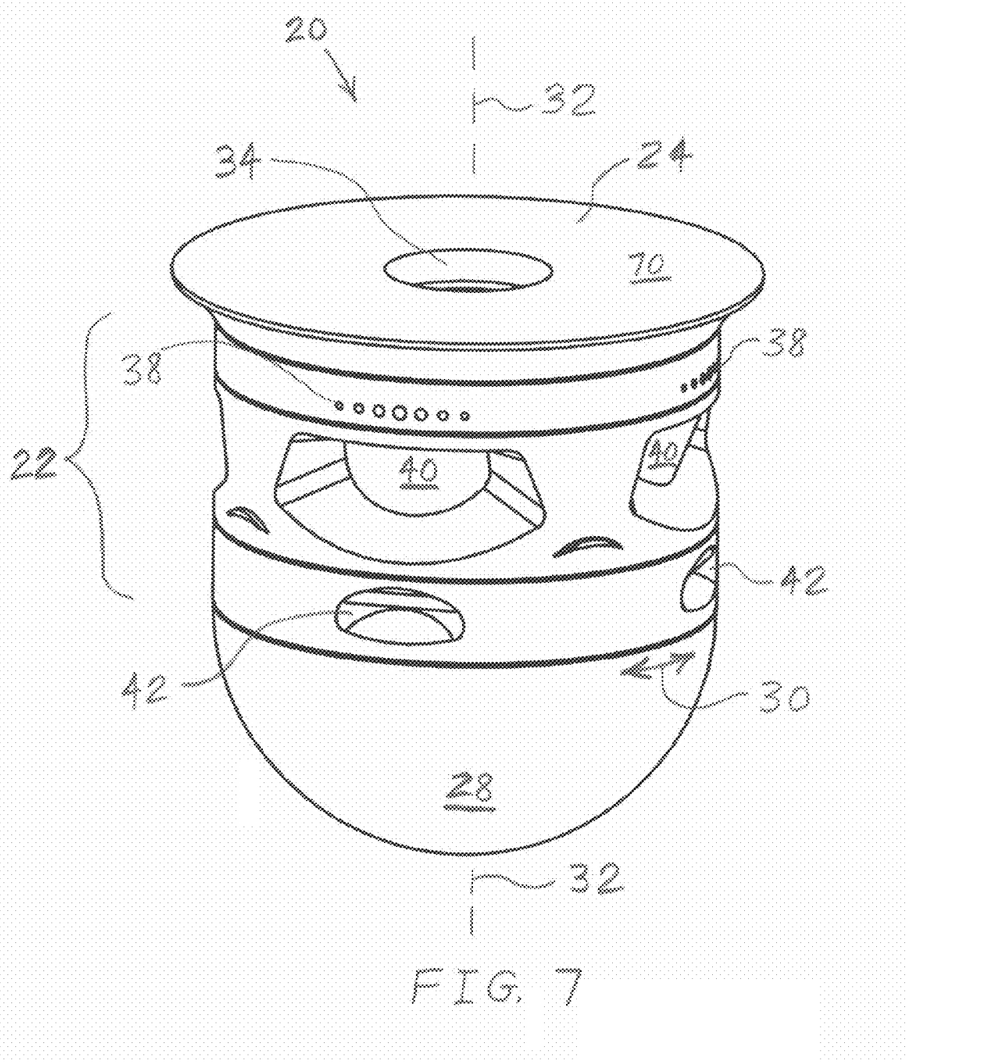
FIG. 7 is a top perspective view of the modular building system arrangement of FIG.

As shown in the enlarged view of FIG. 6, each of electrical connectors 48a-d is substantially L-shaped, having a shorter leg 58 and a longer leg 60. An upper end 62 of shorter leg 58 is attached to a bottom surface 64 of building system 56b. A distal end 66 of longer leg 60 includes a substantially V-shaped notch 68. Each of notches 68 opens in a circumferential direction.

FIGS. 7-10 illustrate arrangement 20 from an upper perspective view. An upper surface 70 of base 24 may engage, and be mounted to, a ceiling or other fixed structure.

Figure 8:
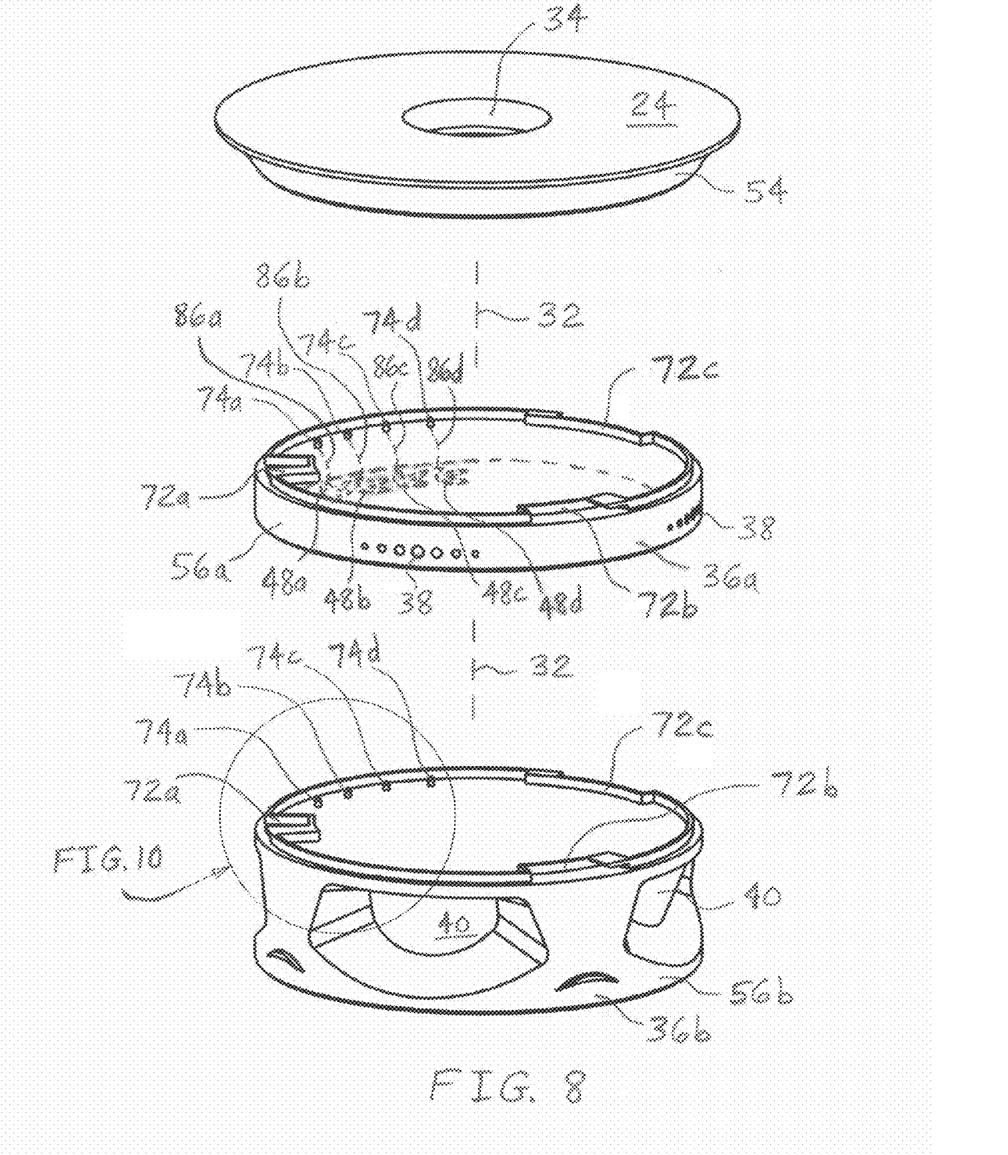
FIG. 8 is an enlarged exploded top perspective view of the base and top two building systems of the modular building system arrangement of FIG. 1.
Figure 9:
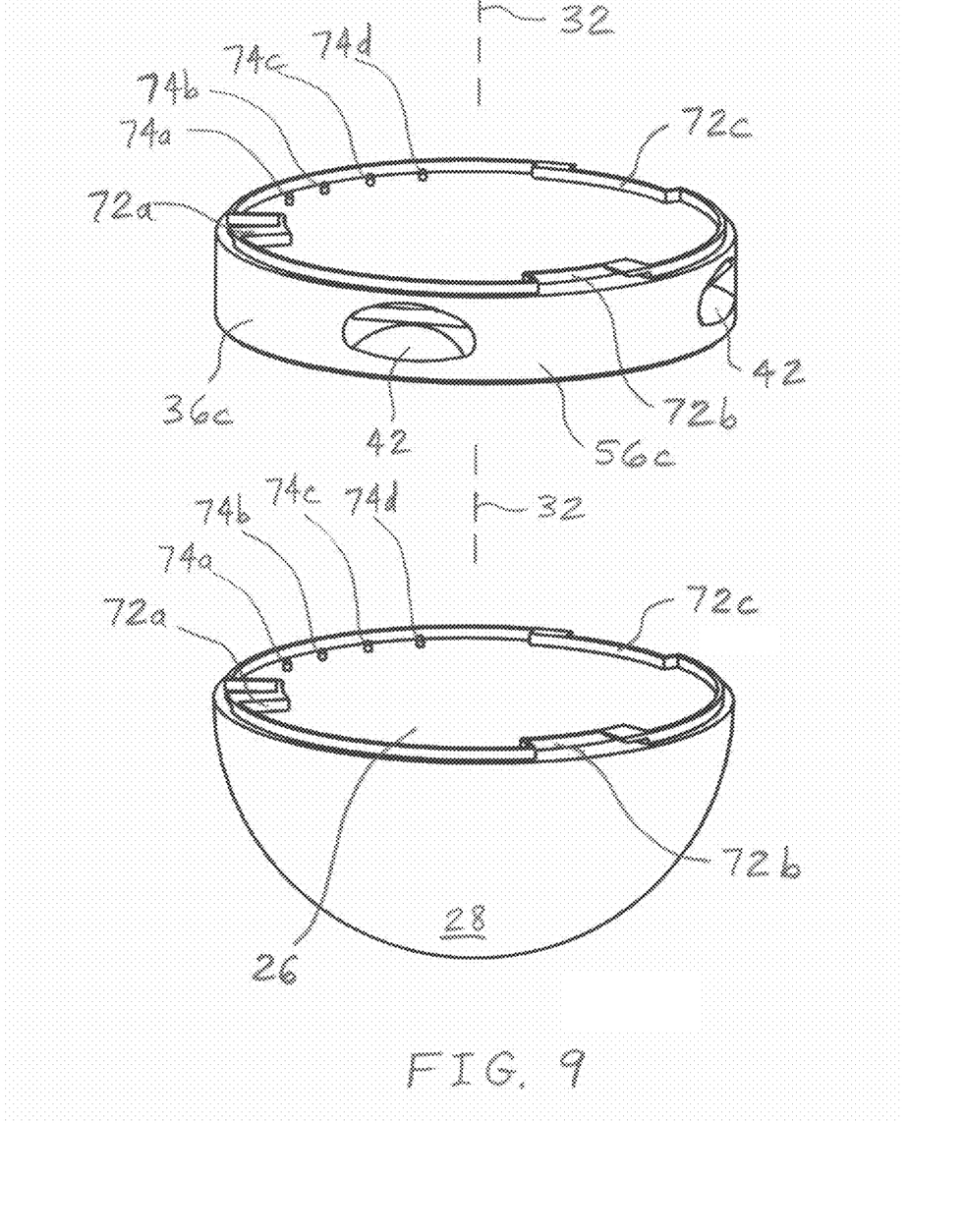
FIG. 9 is an enlarged exploded top perspective view of the bottom building system and end cap of the modular building system arrangement of FIG. 1.

As shown in the exploded views of FIGS. 8 and 9, each of building systems 36a-c and camera 26 includes an identical set of mechanical connectors 72a-c and an identical set of male electrical connectors 74a-d. In addition to each set of mechanical connectors and each set of electrical connectors being identical, each of mechanical connectors 72a-c within a set may be identical, and each of electrical connectors 74a-d within a set may be identical. Each of mechanical connectors 72a-c may be in the form of a slot 75 (FIG. 10) defined by opposite end walls 76, 78, an inner arcuate wall 80, and a top wall 82 connected to both end wall 78 and an end of arcuate wall 80 that is adjacent to end wall 78.

Figure 10:
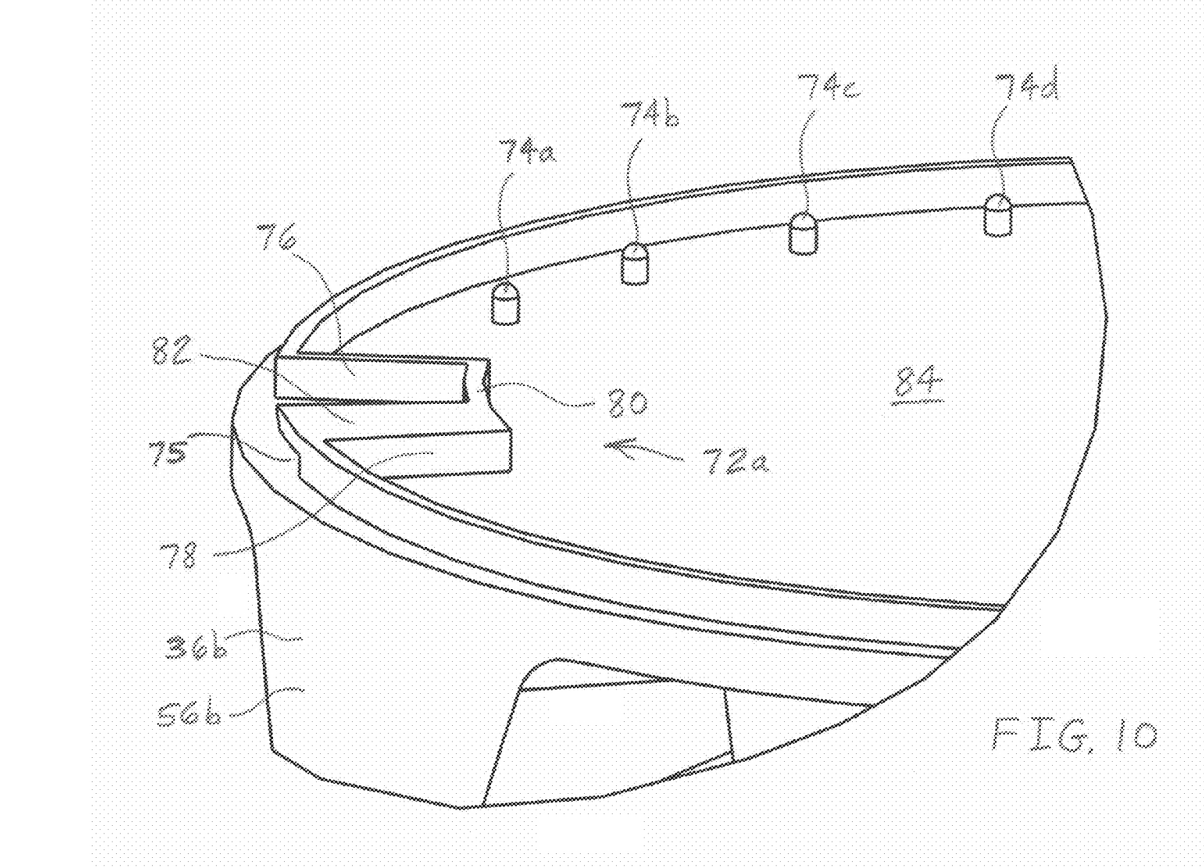
FIG. 10 is a fragmentary enlarged top perspective view of the bottom building system of FIG. 9.

As shown in the enlarged view of FIG. 10, each of electrical connectors 74a-d is in the form of a peg-shaped projection extending from upper surface 84 of building system 36b. Connectors 74a-d may each extend in a direction parallel to axis 32.

Each of electrical connectors 74a-d is electrically connected to a respective one of electrical connectors 48a-d within the same building system via a respective one of electrical conductors 86a-d, as shown in FIG. 8. When arrangement 20 is fully assembled, as in FIGS. 1, 3 and 7, conductors 86a-d in building systems 36a-c provide continuous electrical pathways between connectors 48a-d in base 24 and respective connectors 74a-d in camera 26. In one embodiment, two of these four electrically conductive pathways carry power (i.e., positive and negative voltage or positive voltage and ground) to one or more of base 24, building systems 36a-c and camera 26. The other two of the four electrically conductive pathways may carry control signals and/or data, such as video data and control signals for camera 26.

During assembly or installation, base 24 may first be secured to the ceiling by screws or other fasteners. Building system 36a may then be secured to base 24 by first aligning the open portions of mechanical connectors 72a-c (i.e., the portions of slots 75 not covered by top wall 82) of building system 36a with mechanical connectors 46a-c of base 24. After this alignment, building system 36a may be moved toward base 24 in an axial direction along pan axis 32 until connectors 46a-c are received in the open portions of slots 75. In this position, electrically connecting pegs 74a-d are disposed adjacent to distal ends of metal clips 48a-d, respectively, of base 24. Next, building system 36a may be rotated approximately one-eighth turn (i.e., 45 degrees) about axis 32 in the direction indicated by arrow 88 (FIG. 4) until each of mechanical connectors 46a-c is at least partially received in a portion of slot 75 that is covered by top wall 82 of a respective one of mechanical connectors 72a-c. Each of electrical connectors 74a-d is also received in a notch 68 of a respective one of electrical connectors 48a-d as building system 36a is rotated. Building system 36a may then be released to enable top walls 82 of connectors 72a-c to rest upon and be supported by respective mechanical connectors 46a-c.

Building system 36b may be connected to building system 36a in substantially the same manner as described above for connecting building system 36a to base 24. In turn, building system 36c may be connected to building system 36b, and camera 26 may be connected to building system 36c in substantially the same manner.

As may be evident from the above description of the modularity of the electrical and mechanical connectors of base 24, building systems 36a-c, camera 26 and their housings, it is possible to arrange building systems 36a-c in any order between base 24 and camera 26. That is, building system 36b may be connected directly to base 24 with either system 36a in the middle and system 36c connected to camera 26, or with system 36c in the middle and system 36a connected to camera 26. Similarly, building system 36c may be connected directly to base 24 with either system 36a in the middle and system 36b connected to camera 26, or with system 36b in the middle and system 36a connected to camera 26.

The above-described modularity of arrangement 20 further enables any number of building systems 36 to be included in a building system assembly. That is, although three building systems 36a-c are shown in the embodiment of the drawings, any other number of building systems (e.g., one, two, four, five, etc.) may be included in a modular building system arrangement of the invention.

Additional types of building systems that may be employed in the present invention include an audio output building system (not shown) which provides a synchronized siren function for intrusion alarm and fire/smoke alarm. The audio output building system may also provide public address (PA) voice function; two-way communications when used with microphone ring 36a; and/or a background music function.

Another building system that may be employed is a less-than-lethal-deterrent type, which is intended to deter or inhibit the intended actions of a sensed intruder. Such less-than-lethal-deterrent building systems may be characterized by a pepper spray cloud that fills a large area; a pepper spray stream that is aimed by use of target location information provided by camera video motion sensing; high output sound pressure; a tazer that is aimed by use of target location information provided by camera video motion sensing; a smoke screen, such a theatrical smoke, that is used to confuse an intruder and prevent the intruder from seeing things that can be stolen; or a stink bomb, which is less intrusive than other options above. In one embodiment, the above-described less-than-lethal-deterrent building systems are aimed or armed by a human in a central station. Such less-than-lethal-deterrent building systems may have the advantage of providing a faster response to an intruder than may be provided by local police.

Other types of building systems that may be included in the present invention include a smoke alarm building system, and a temperature sensor building system. The smoke alarm building system, after sensing smoke, may transmit an alarm signal only if the presence of smoke and/or fire is verified by video data provided by camera 26. The temperature sensor building system may provide a low temperature alarm signal and/or a high temperature alarm signal.

All of the additional types of building systems described above may have the same types of electrical and mechanical connectors as building systems 36a-c. Thus, a building system assembly may be formed of any combination or number of the building systems described herein, and the building systems may be assembled in any order from the base to the camera or other type of end cap.

In a particular embodiment, base 24, camera 26, and each of the above-described building systems (i.e., building systems 36*a-c* and the additional building systems described by not shown herein) may be provided in a kit. The end user or installer may then choose a subset of the building systems provided in the kit to include in a building system assembly that suits the requirements of a particular application.

During removal, or uninstallation, the human user may grasp camera 26 and rotate it in direction 90 (FIG. 1) that is opposite to direction 88. As camera 26 rotates in direction 90, mechanical connectors 46*a-c* slide completely out of the covered portions of slots 75 and become aligned with the open portions of slots 75. In this position, camera 26 may be pulled away from building system 36*c* in a direction parallel to axis 32. Similarly, by rotating building system 36*c* in direction 90, building system 36*c* may be decoupled from building system 36*b* such that system 36*c* may be pulled away from system 36*b* in the direction parallel to axis 32. This procedure may be repeated until each of the building systems, or the building system that is desired to be removed, has been pulled away from the remainder of arrangement 20. For example, camera 26 may be thus removed from building system assembly 22, and a different camera 26 may be installed on building system assembly 22 if so desired.

As described above, base 24 may be mounted to a ceiling of a room. However, base 24 may alternatively be mounted to a vertical surface such as a wall. A pendant-type housing that is attached to a wall, and the coupling between a housing and a surveillance window, are disclosed in U.S. patent application Ser. No. 10/967,856, entitled COMPOUND DOME WINDOW FOR A SURVEILLANCE CAMERA, filed Oct. 18, 2004, now U.S. Pat. No. 7,306,383, which is hereby incorporated by reference herein.

According to the present invention, a modular building system kit may further include one or more additional versions of the base, building systems and the camera. Thus, the kit may include a group of bases, a group of microphone building systems, a group of PIR motion detection building systems, a group of lighting building systems, groups of the other building systems described herein, and a group of cameras. A user or assembler may select one representative unit from each of the groups, or from a subset of the groups, to thereby assemble a building system arrangement in a selected one of a plurality of possible combinations. Each of the units within a given group may have a respective set of performance characteristics, and the selectable units across all of the groups may have common electrical and mechanical connectors. Thus, each building system may be interchangeable with a building system of the same group or of any other group of building systems in terms of mechanical and electrical connectivity, and perhaps also in terms of size and shape. For example, each of the building systems and the camera may have an outer housing with a circular shape when viewed along axis 32. Further, the outer housings of each of the building systems and the camera may have an equal diameter and circumference. This constant size and shape provides arrangement 20 with a profile that has a constant width along axis 32 and that is constant from any viewpoint along the 360 degree arc surrounding axis 32. However, it is possible within the scope of the invention that, due to the different performance characteristics of the units within a group, not all units within a given group are fully operationally compatible with all units of the other groups.

When one of the units needs to be upgraded or replaced due to a malfunction, the unit may be relatively easily replaced with a unit from the same group or from a different group without the need for special tools. Thus, the building system arrangement may be upgraded or serviced in the field without having to send the entire building system arrangement to a repair facility. Additionally, the building system kit of the present invention advantageously allows a manufacturer to more easily manufacture replacement parts and new, more advanced parts due to the modular configuration. Thus, a user of the building system arrangement can easily upgrade or reconfigure the system to the user's dynamic specifications.

In one embodiment, arrangement 20 includes electrical circuitry, e.g., hot swap circuitry (not shown) and/or tristatable signal lines, at the interfaces with between base 24, building systems 36*a-c* and camera 26. Hot swap circuitry may include components to prevent an in-rush of current when a new unit is installed with power supplied to the building system arrangement. Alternatively, the electrical connections may comprise any other in-rush current limiting electrical connections. Such hot swap circuitry may include resistor-capacitor circuits or other dampening circuits for reducing the magnitude and/or time duration of voltage transients or current transients to which a unit may be exposed upon being connected to an energized unit. Hot swap circuitry essentially reduces the chance of damage from unintended current paths to components or units that are added to the building system arrangement while the power remains supplied thereto. For example, the hot swap circuitry may enable camera 26 to be moved into electrical connection with an energized building system 36 and/or with an energized base 24 with a reduced risk of damage therefrom. The hot swap circuitry may additionally or alternatively enable a building system 36 to be moved into electrical connection with any other energized building system or with an energized base 24 with a reduced risk of damage therefrom. Hot swap circuitry is described in an article entitled "Introduction to Hot Swap", authored by Jonathan M. Bearfield of Texas Instruments, available at www.techonline.com, published on Sep. 24, 2001, the disclosure of which is hereby expressly incorporated herein by reference.

Tristatable signal lines may provide high, low, and disabled electrical states. The disabled state, in which the signal lines are provided with a high level of electrical resistance, may take effect whenever a video signal from the camera is lost or is turned off. Thus, in the disabled state, a camera may be serviced or replaced with a reduced risk of high currents entering and possibly damaging the camera.

Particular mechanical and electrical couplings between camera 26, building systems 36*a-c* and base 24 are described above with reference to FIGS. 1-10. However, it is to be understood that camera 26, building systems 36*a-c* and base 24 may be coupled to each other via other suitable electrical and mechanical connections. For example, a camera may be mechanically attached to a building system or to a base via a bayonet-type connection, a snap-fit engagement, a threaded engagement, one or more fasteners, or any other type of suitable connection which permits easy removal while simultaneously providing secure mechanical connection and simultaneous electrical connection.

During service or assembly, a user or repair person of building system arrangement 20 may advantageously remove and replace each of the units of building system arrangement 20 with an upgraded version or with a repaired version of each unit, or reconfigure a system of multiple arrangements by interchanging units between multiple arrangements in the system. For example, when a retailer rearranges displays to produce different traffic patterns through the store, he may swap system controllers between two cameras to place autotracking capability in a different location. Similarly, it may be desirable to swap a pan, tilt, zoom (PTZ) camera with a fixed or imitation camera. Building system arrangement 20 has modular capability, i.e., each component may be replaced or repaired without removing or reinstalling the entire building system arrangement 20. For example, building system 36b may be removed and replaced with an upgraded unit or with a repaired unit, if building system 36b has malfunctioned, without changing the components or the configuration of the remainder of building system arrangement 20. As described above, the user may selectively remove building system 36b from its mechanical and electrical connections to building system 36a and to building system 36c. Similarly, base 24, building system 36a, building system 36c, and camera 26 may be selectively removed and replaced with an upgraded but like unit or with a repaired like unit without changing the components or the configuration of the remainder of building system arrangement 20.

Due to the modularity of the building system arrangement, the present invention may be provided in the form of a kit including groups of different versions of the various units. The versions of the units may differ in terms of their respective sets of performance characteristics, but may have the same shape, size, and mechanical and electrical connectors. The installer may assemble a building system arrangement in a selected one of a plurality of possible combinations by selecting one version from each unit group.

Due to the common size and shape of the units within a certain group, any combination of the base, building systems and camera may have a same, constant width as measured in a horizontal direction. Further, any camera may be coupled to any bottommost building system such that the camera has an unimpeded view.

In an embodiment of a method of the present invention, an operator of a site, such as a casino or retail store, may select a camera from a group of cameras each having a respective set of performance characteristics and common electrical and mechanical connectors. One or more building systems may also be selected from a group of building systems each having a respective set of performance characteristics and common electrical and mechanical connectors. Each of the building systems may be operationally compatible with two or more of the cameras. A base may further be selected from a group of bases each having a respective set of performance characteristics and common electrical and mechanical connectors. Each of the bases may be operationally compatible with two or more of the cameras and with two or more of the building systems. A building system arrangement may be assembled such that the selected camera is coupled to an assembly of building systems and such that the selected assembly of building systems electrically and mechanically interconnects the selected camera and the selected base.

As may be characteristic of modularity, each of the various units of a group of like units may have a substantially similar appearance. Thus, the appearance of one unit of a group may be representative of the appearance of every other unit of the group of like units.

Although only a single modular building system arrangement 20 has been described herein, in another embodiment, multiple modular building system arrangements are networked together. The networked arrangements may be in a single building or may be in multiple buildings. Each arrangement may share the sensor data it produces with every other arrangement in the network. Thus, an arrangement may react, such as by activating an alarm siren, to sensor data received from any other arrangement in the network.

While this invention has been described as having an exemplary design, the present invention may be further modified within the spirit and scope of this disclosure. This application is therefore intended to cover any variations, uses, or adaptations of the invention using its general principles.

What is claimed is:

1. A modular building system arrangement, comprising a plurality of electrical building systems, each said building system having a housing with a mechanical connector that is connectable with a like said connector of each other said building system housing, any subset of the building system housings being connectable with each other to form a building system assembly, the building systems of the building system assembly conjointly defining an electrically conductive pathway interconnecting each of the building systems of the building system assembly, the pathway being configured to carry at least one of power and data, each said building system including a first surface and a second surface, the first surface having at least one male electrical connector, the second surface having at least one female electrical connector electrically connected to the at least one male electrical connector, each said male electrical connector being connectable with the female connector of each other said building system, the building systems of the building system assembly being aligned along an axis, the electrical connectors being connectable with each other by rotating adjacent ones of said building systems relative to each other about the axis.

2. The arrangement of claim 1 further comprising a base configured to be mounted to a fixed structure, the base being connectable to a proximal one of the building systems.

3. The arrangement of claim 1 wherein the electrically conductive pathway passes through each of the female connectors and each of the male connectors.

4. The arrangement of claim 1 wherein the pathway is configured to carry power to each of the building systems, the pathway being configured to carry data at least one of to and from each of the building systems.

5. The arrangement of claim 1 wherein the building systems of the building system assembly are aligned along an axis, the mechanical connectors being connectable with each other by rotating adjacent ones of said building systems relative to each other about the axis.

6. The arrangement of claim 1 wherein the at least one female electrical connector is L-shaped and includes a first leg and a second leg, the first leg being shorter than the second leg.

7. The arrangement of claim 6 wherein the second leg includes a substantially V-shaped notch opening in a circumferential direction.

8. The arrangement of claim 1 wherein the electrical connectors are connectable with each other by rotating adjacent ones of said building systems relative to each other about the axis such that the electrical connectors move in circumferential directions into initial engagement with each other.

9. A modular building system arrangement, comprising:
a base having an upper surface and a lower surface, the upper surface being configured to be mounted to a fixed structure, the lower surface having at least one first lower electrical connector;
a plurality of electrical building systems, each said building system including an upper surface and a lower surface, the upper surface having at least one upper electrical connector, the lower surface having at least one second lower electrical connector electrically connected to the at least one upper electrical connector, each said upper electrical connector being connectable with the first lower connector of the base and connectable with the second lower connector of each other said building system, any subset of the building systems being connectable with each other in any order to form a building system assembly, the building systems being aligned along an axis, each of the building systems including an upper surface with a first mechanical connector and a lower surface with a second mechanical connector, the building systems being connectable with each other by rotating adjacent ones of said building systems relative to each other about the axis such that a respective said first mechanical connector and a respective said second mechanical connector on said adjacent ones of said building systems become connected, and the electrical connectors are connectable with each other and moved into engagement with each other in circumferential directions by rotating adjacent ones of said building systems relative to each other about the axis; and an end cap module connectable to a distal one of the electrical building systems that is farthest from the base in the building system assembly such that the at least one second lower electrical connector of the distal electrical building system is substantially covered by the end cap module.

10. The arrangement of claim 9 wherein the end cap module comprises an electrical end cap module electrically connected to the at least one second lower electrical connector of the distal electrical building system.

11. The arrangement of claim 10 wherein the electrical end cap module comprises a surveillance camera, the arrangement further comprising a covert liner covering and connected to the surveillance camera.

12. The arrangement of claim 9 wherein a proximal one of the electrical building systems that is closest to the base in the building system assembly is connected to the base.

13. The arrangement of claim 9 wherein the electrical connectors are configured to carry power to each of the building systems, the electrical connectors being configured to carry data at least one of to and from each of the building systems.

14. The arrangement of claim 9 wherein the base and an uppermost said building system are connectable with each other by rotating the uppermost building system about the axis.

15. A modular building system arrangement, comprising:
a base configured to be mounted to a fixed structure, the base including at least one first lower mechanical connector;
a plurality of electrical building systems, each said building system including at least one upper mechanical connector and at least one second lower mechanical connector, each said upper mechanical connector being connectable with the first lower connector of the base and connectable with the second lower connector of each other said building system, any subset of the building systems being connectable with each other in any order to form a building system assembly, each said building system includes a first surface and a second surface, the first surface having at least one male electrical connector, the second surface having at least one female electrical connector electrically connected to the at least one male electrical connector, the at least one female electrical connector being L-shaped and including a first leg and a second leg, the second leg including a substantially V-shaped notch opening in a circumferential direction, each said male electrical connector being connectable with the female connector of each other said building system, the building systems of the building system assembly being aligned along an axis, the electrical connectors being connectable with each other by rotating adjacent ones of said building systems relative to each other about the axis; and an end cap connectable to the at least one second lower mechanical connector of a distal one of the electrical building systems that is farthest from the base in the building system assembly.

16. The arrangement of claim 15 wherein the building systems of the building system assembly conjointly define an electrically conductive pathway interconnecting each of the building systems of the building system assembly, the pathway being configured to carry at least one of power and data, the electrically conductive pathway passing through each of the female connectors and each of the male connectors.

17. The arrangement of claim 16 wherein the pathway is configured to carry power to each of the building systems, the pathway being configured to carry data at least one of to and from each of the building systems.

18. The arrangement of claim 15 wherein the mechanical connectors are connectable with each other by rotating adjacent ones of said building systems relative to each other about the axis.

19. The arrangement of claim 15 wherein the mechanical connectors of adjacent said building systems are connected together and the electrical connectors of the adjacent said building systems are connected together as a result of a same said rotation of the adjacent building systems relative to each other about the axis.

20. The arrangement of claim 15 wherein the connection of the mechanical connectors of adjacent said building systems and the connection of the electrical connectors of adjacent said building systems occur simultaneously during said rotation of said adjacent building systems relative to each other about the axis.

* * * * *